US008486815B2

United States Patent
Huang et al.

(10) Patent No.: US 8,486,815 B2
(45) Date of Patent: Jul. 16, 2013

(54) BACK-SIDE ILLUMINATION IMAGE SENSOR AND METHOD FOR FABRICATING BACK-SIDE ILLUMINATION IMAGE SENSOR

(75) Inventors: Fang-Ming Huang, Grand Cayman (KY); Tsung-Chieh Chang, Grand Cayman (KY)

(73) Assignees: Himax Imaging, Inc., Grand Cayman (KY); Himax Semiconductor, Inc., Fonghua Village, Xinshi Dist., Tainan (TW)

( * ) Notice: Subject to any disclaimer, the term of this patent is extended or adjusted under 35 U.S.C. 154(b) by 182 days.

(21) Appl. No.: 13/101,148

(22) Filed: May 5, 2011

(65) Prior Publication Data

US 2012/0280343 A1  Nov. 8, 2012

(51) Int. Cl.
*H01L 31/14* (2006.01)

(52) U.S. Cl.
USPC .............. 438/529; 438/57; 438/70; 257/228; 257/460; 257/E31.058; 257/E31.127

(58) Field of Classification Search
USPC ........ 438/529, 70, 57, 91, 514; 257/E31.127, 257/432, 228, 460, 461, 229, 230, 231, 232, 257/233, 292, E31.058, E31.063, E31.115, 257/E27.133, E25.032
See application file for complete search history.

(56) References Cited

U.S. PATENT DOCUMENTS

| | | | |
|---|---|---|---|
| 6,593,607 B1 * | 7/2003 | Hseih | 257/292 |
| 6,677,656 B2 * | 1/2004 | François | 257/462 |
| 2005/0221541 A1 * | 10/2005 | Metzler et al. | 438/142 |
| 2008/0181634 A1 * | 7/2008 | Kinoshita | 399/39 |
| 2009/0200580 A1 * | 8/2009 | Rhodes et al. | 257/233 |
| 2009/0200590 A1 * | 8/2009 | Mao et al. | 257/292 |
| 2009/0242939 A1 * | 10/2009 | Kurita et al. | 257/228 |
| 2010/0108893 A1 * | 5/2010 | Flitsch et al. | 250/361 R |
| 2010/0109060 A1 * | 5/2010 | Mao et al. | 257/292 |
| 2010/0159632 A1 * | 6/2010 | Rhodes et al. | 438/73 |
| 2010/0164035 A1 * | 7/2010 | Kim | 257/432 |
| 2010/0164041 A1 * | 7/2010 | Kim | 257/435 |
| 2010/0181634 A1 * | 7/2010 | Wang et al. | 257/432 |
| 2010/0181635 A1 * | 7/2010 | Wang et al. | 257/432 |
| 2010/0207231 A1 * | 8/2010 | Iwamoto et al. | 257/461 |

\* cited by examiner

*Primary Examiner* — Cuong Q Nguyen
*Assistant Examiner* — Yosef Gebreyesus
(74) *Attorney, Agent, or Firm* — Winston Hsu; Scott Margo

(57) ABSTRACT

A method for fabricating a back-side illumination image sensor includes: implanting a first type of dopant into an epitaxial layer disposed over a first side of a substrate layer to form a first dopant layer in a first side of the epitaxial layer; adhering a carry layer over the first dopant layer for carrying the substrate layer; grinding a second side of the substrate layer for exposing a second side of the epitaxial layer; implanting the first type of dopant into the epitaxial layer from the second side of the epitaxial layer to form a second dopant layer in the second side of the epitaxial layer; forming at least one metal layer over the second dopant layer after forming the second dopant layer in the second side of the epitaxial layer; removing the carry layer; and forming a color filtering module over the first dopant layer.

11 Claims, 12 Drawing Sheets

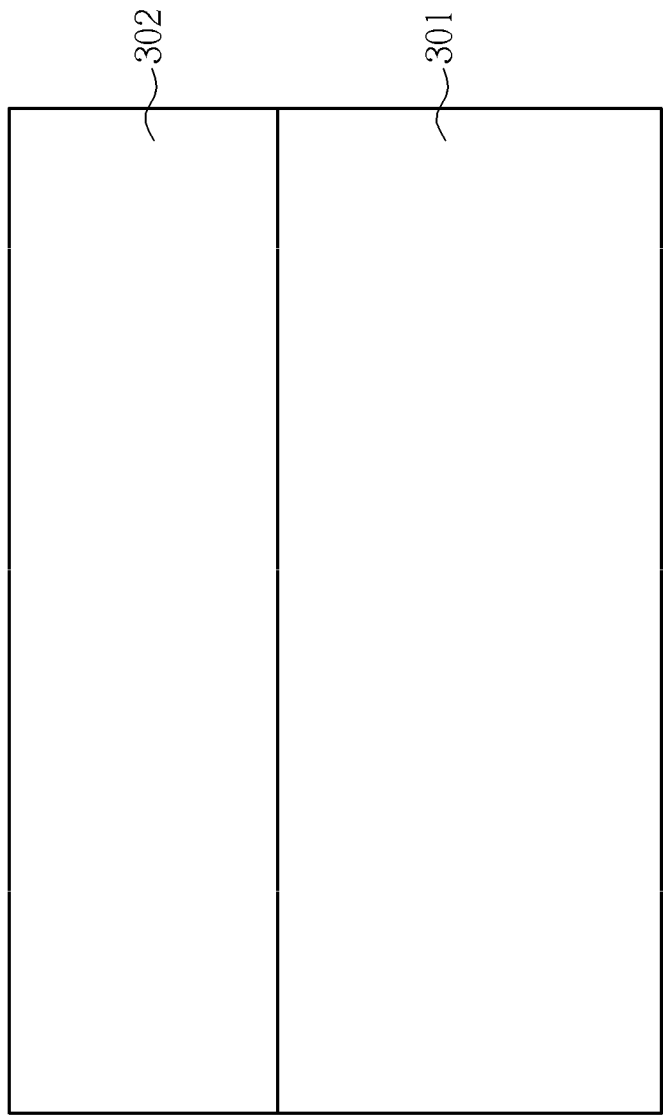

BACK-SIDE ILLUMINATION IMAGE SENSOR AND METHOD FOR FABRICATING BACK-SIDE ILLUMINATION IMAGE SENSOR

BACKGROUND OF THE INVENTION

1. Field of the Invention

The present invention relates to an image sensor and a method for fabricating an image sensor, and more particularly to a back-side illumination image sensor and a method of fabricating a back-side illumination image sensor.

2. Description of the Prior Art

As the pixel size of a complementary metal-oxide-semiconductor image sensor (CMOS image sensor, CIS) grows smaller, the degradation resulting from certain factors such as quantum efficiency, cross-talk and dark current in a sensor array also becomes significant. Regarding a conventional image sensor such as a front-side illuminated sensor, a microlens of each pixel sensor is fabricated on a front side of a substrate. Therefore, the incident light has to travel through dielectric layers between circuitry formed by metal layers to arrive at a photodiode otherwise it may be reflected or absorbed by metal or any other reflective material. Since the traveling path of light cannot be blocked by metal or any other kind of reflective material, the fill factor is limited.

In order to enhance the compactness of an image sensor, a back-side illumination (BSI) image sensor was introduced. In a BSI image sensor, the incident light is projected from a back side of a substrate of the image sensor, and therefore the front side of the substrate can be reserved for circuitry of various functions. With the utilization of the BSI technology, there are more and more available areas on the front side of the substrate for building various functional circuits. Furthermore, in the BSI image sensor, the photodiode of the BSI image sensor is utilized for transforming incident light into electrical signals. Thus, the transforming efficiency of the photodiode may decide the quality (e.g., sensitivity) of the BSI image sensor, wherein the transforming efficiency is decided by the doping regions of the N-implanted layer and the P-implanted layer of the photo-diode. Therefore, to further exploit advantages of the BSI structure, more and more effort is dedicated to improve an area efficiency and compactness of a BSI image sensor.

SUMMARY OF THE INVENTION

One of the objectives of the present invention is to therefore provide a back-side illumination image sensor and a method for reducing the loss of incident light injected into the back-side illumination image sensor to increase sensitivity of the back-side illumination image sensor.

According to a first embodiment of the present invention, a method for fabricating a back-side illumination image sensor is provided. The method comprises the steps of: implanting a first type of dopant into an epitaxial layer disposed over a first side of a substrate layer to form a first dopant layer in a first side of the epitaxial layer; adhering a carry layer over the first dopant layer for carrying the substrate layer; grinding a second side of the substrate layer for exposing a second side of the epitaxial layer; implanting the first type of dopant into the epitaxial layer from the second side of the epitaxial layer to form a second dopant layer in the second side of the epitaxial layer, wherein the first dopant layer overlaps the second dopant layer; forming at least one metal layer over the second dopant layer after forming the second dopant layer in the second side of the epitaxial layer; removing the carry layer; and forming a color filtering module over the first dopant layer.

According to a second embodiment of the present invention, a back-side illumination image sensor is provided. The back-side illumination image sensor comprises an epitaxial layer, a first dopant layer, a second dopant layer, a color filtering module, and at least one metal layer. The first dopant layer has a first type of dopant, and the first dopant layer is implanted into a first side of the epitaxial layer. The second dopant layer has the first type of dopant, and is implanted into a second side of the epitaxial layer, wherein a first side of the first dopant layer overlaps a first side of the second dopant layer. The color filtering module is formed over a second side of the first dopant layer. The metal layer is formed over a second side of the second dopant layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3A is a diagram illustrating a partial cross-sectional view of a substrate layer having an epitaxial layer formed in one side.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
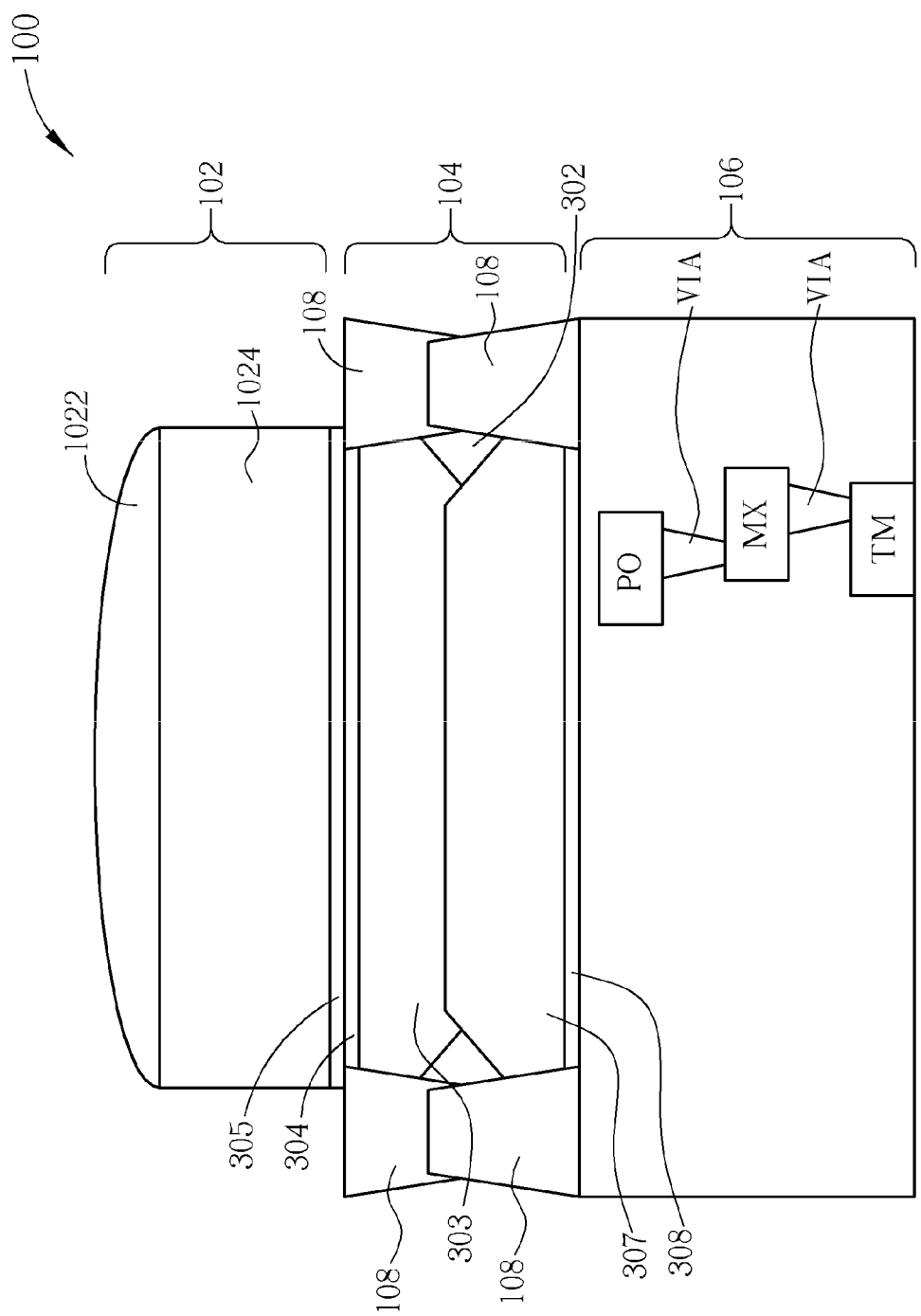
FIG. 1 is a diagram illustrating a back-side illumination image sensor according to a first embodiment of the present invention.
Figure 2:
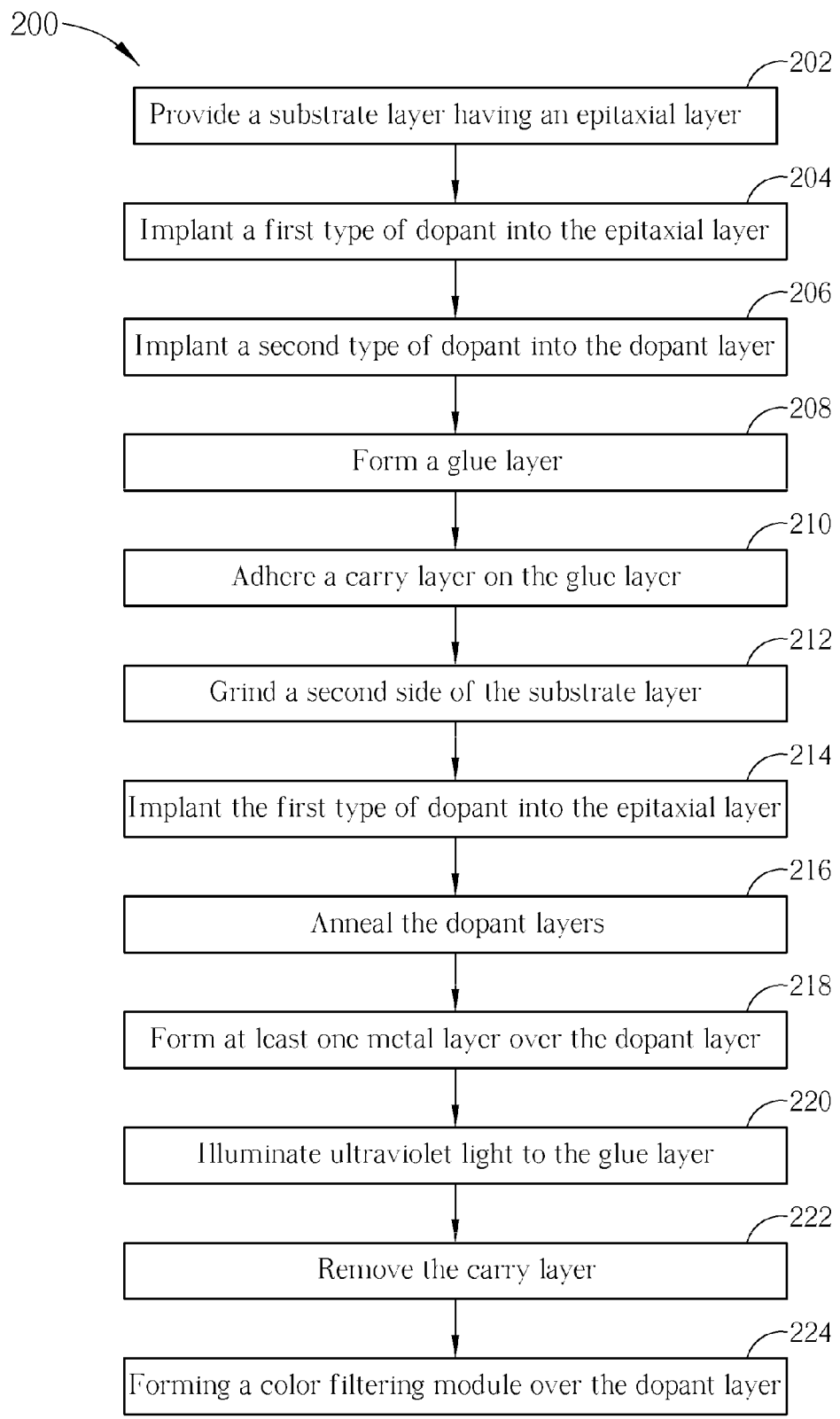
FIG. 2 is a flow chart illustrating a method for fabricating the BSI image sensor according to a second embodiment of the present invention.

Please refer to FIG. 1 and FIG. 2. FIG. 1 is a diagram illustrating a back-side illumination (BSI) image sensor 100 according to an embodiment of the present invention. FIG. 2 is a flow chart illustrating a method 200 for fabricating the BSI image sensor 100 according to an embodiment of the present invention. FIG. 1 is a partial cross-sectional view of a pixel structure of the BSI image sensor 100. The BSI image sensor 100 comprises a color filtering module 102, a photodiode 104, a circuit layer 106, and an isolation structure 108. The photodiode 104 transforms incident light into electrical signals. The circuit layer 106 may comprise a transfer transistor (e.g., an N-type metal-oxide-silicon transistor fabricated on a P well) to transmit the electrical signals from the photo-diode 104 to other circuits for subsequent processing. The isolation structure 108 is employed to isolate adjacent pixels.

Figure 3B:
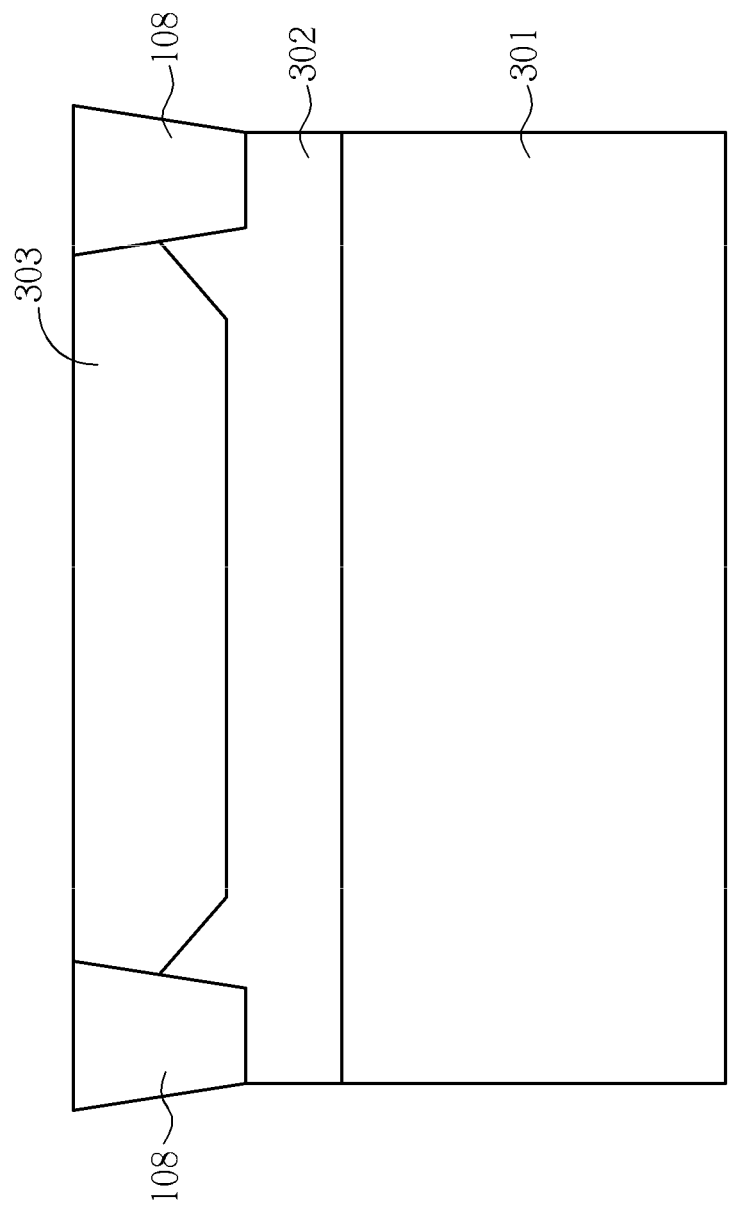
FIG. 3B is a diagram illustrating the partial cross-sectional view of an N-type dopant layer in a first side of the epitaxial layer.
Figure 3C:
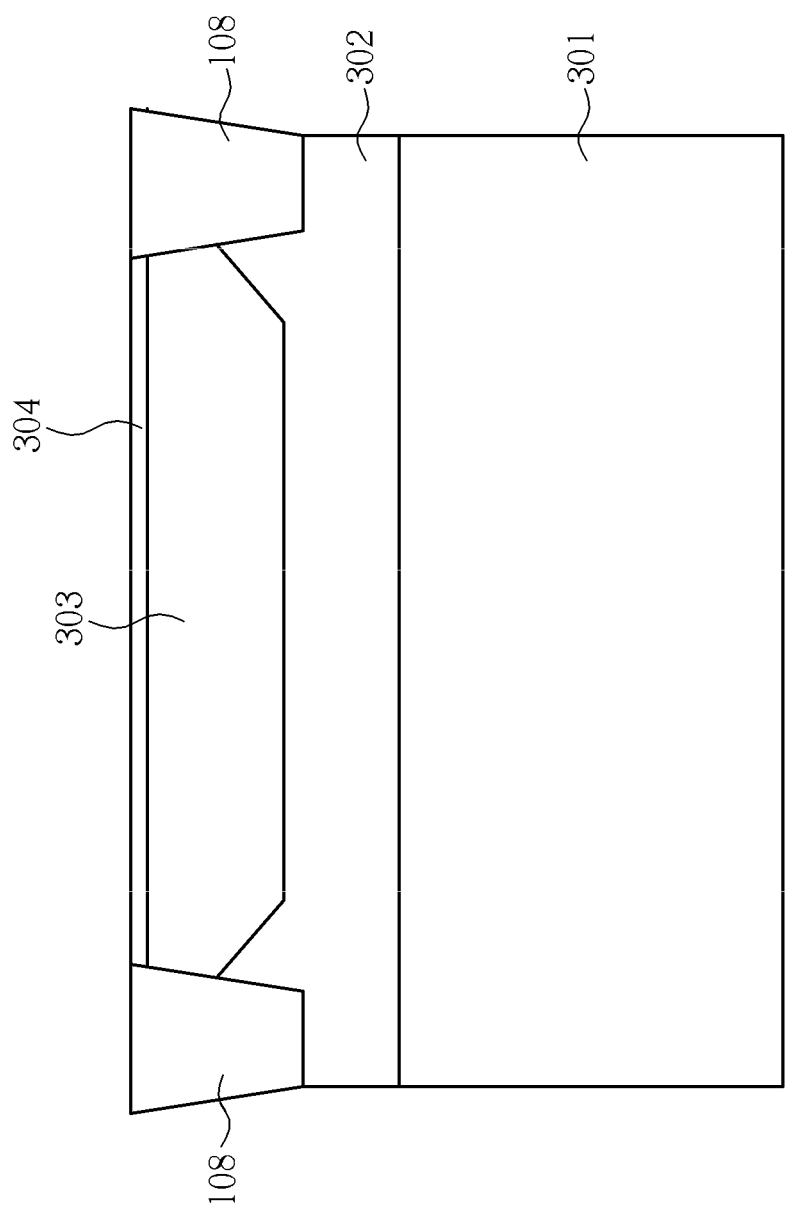
FIG. 3C is a diagram illustrating the partial cross-sectional view of a P-type dopant layer in the N-type dopant layer of the first side of the epitaxial layer.
Figure 3D:
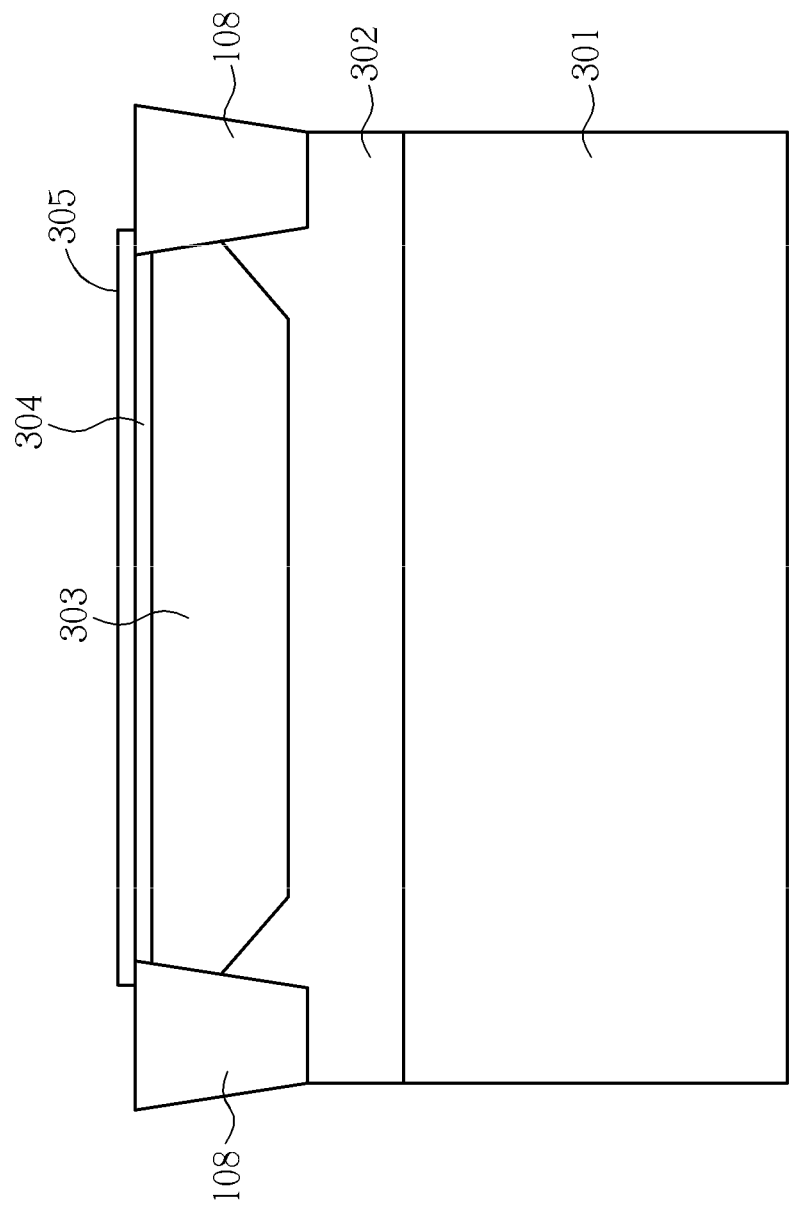
FIG. 3D is a diagram illustrating the partial cross-sectional view of a glue layer over the P-type dopant layer.
Figure 3E:
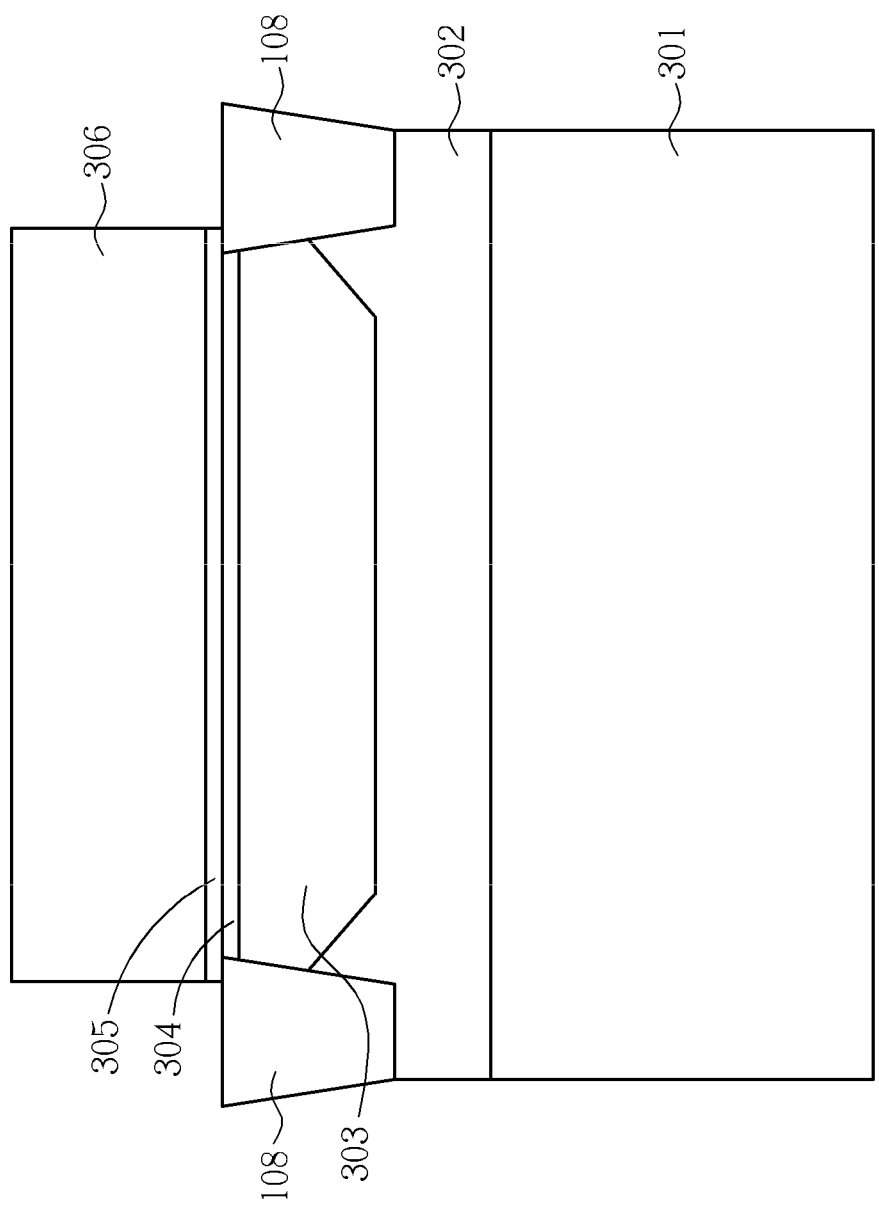
FIG. 3E is a diagram illustrating the partial cross-sectional view of a carry layer on the glue layer.
Figure 3F:
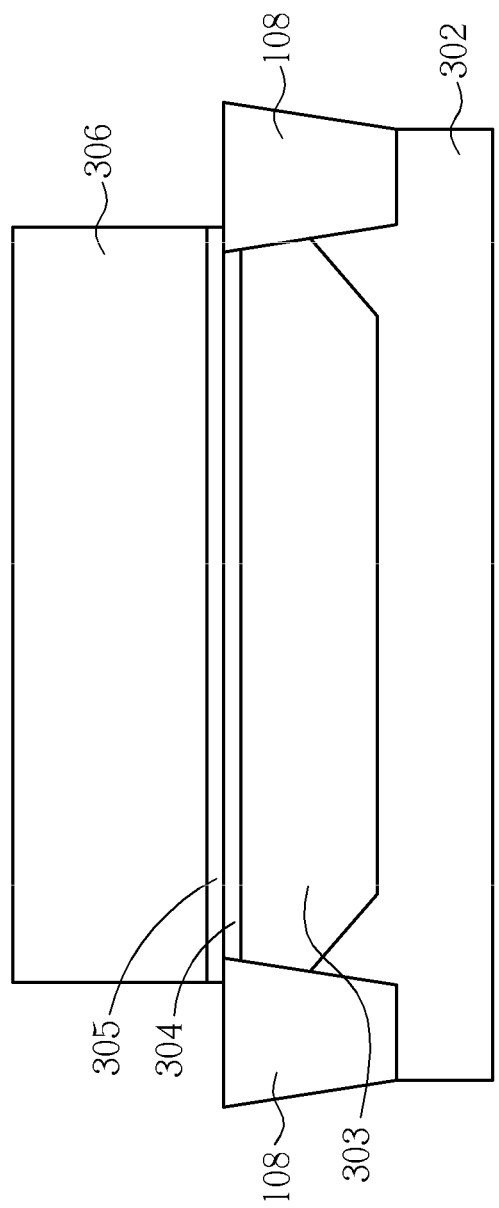
FIG. 3F is a diagram illustrating the partial cross-sectional view of exposing a second side of the epitaxial layer.
Figure 3G:
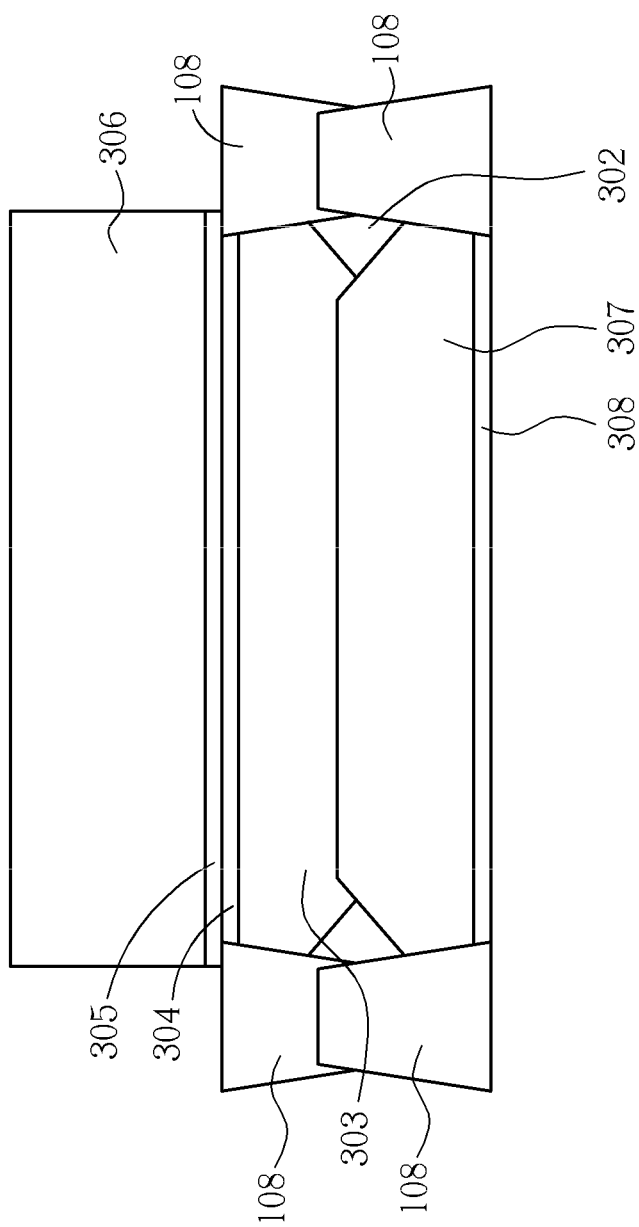
FIG. 3G is a diagram illustrating the partial cross-sectional view of an N-type dopant layer in the second side of the epitaxial layer.
Figure 3H:
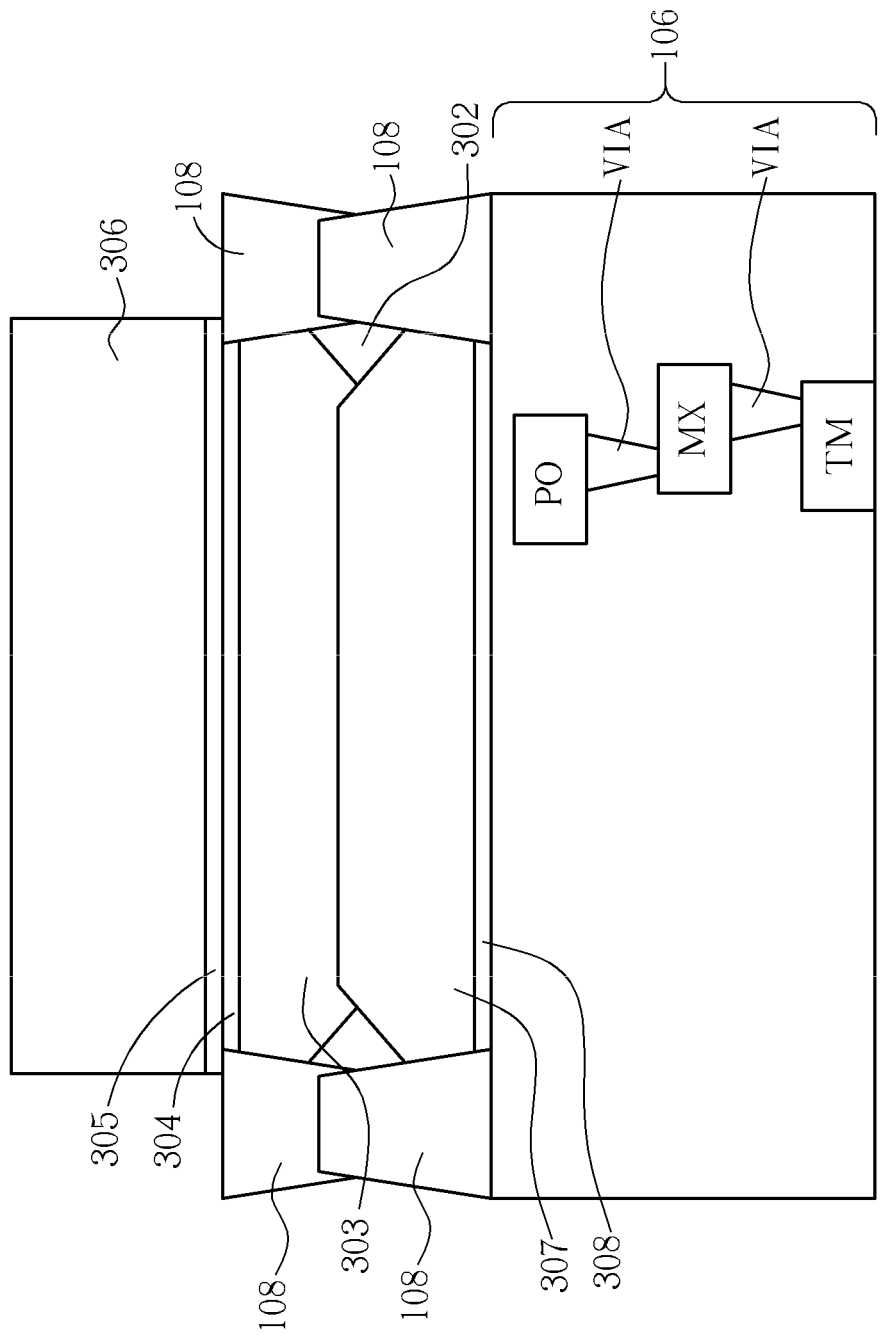
FIG. 3H is a diagram illustrating the partial cross-sectional view of at least one metal layer.
Figure 3I:
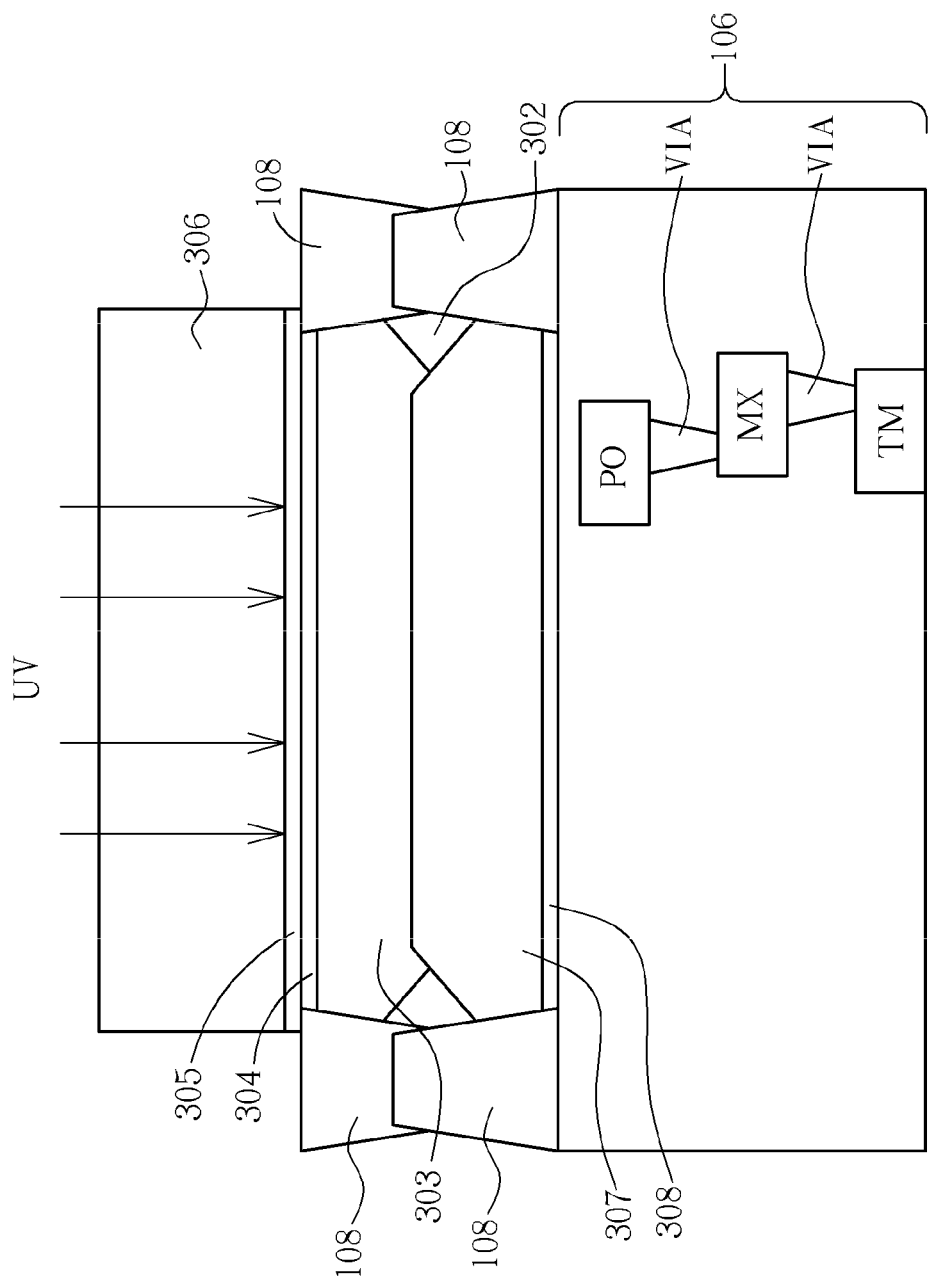
FIG. 3I is a diagram illustrating the partial cross-sectional view of de-gluing the glue layer by illuminating ultraviolet light to the glue layer.
Figure 3J:
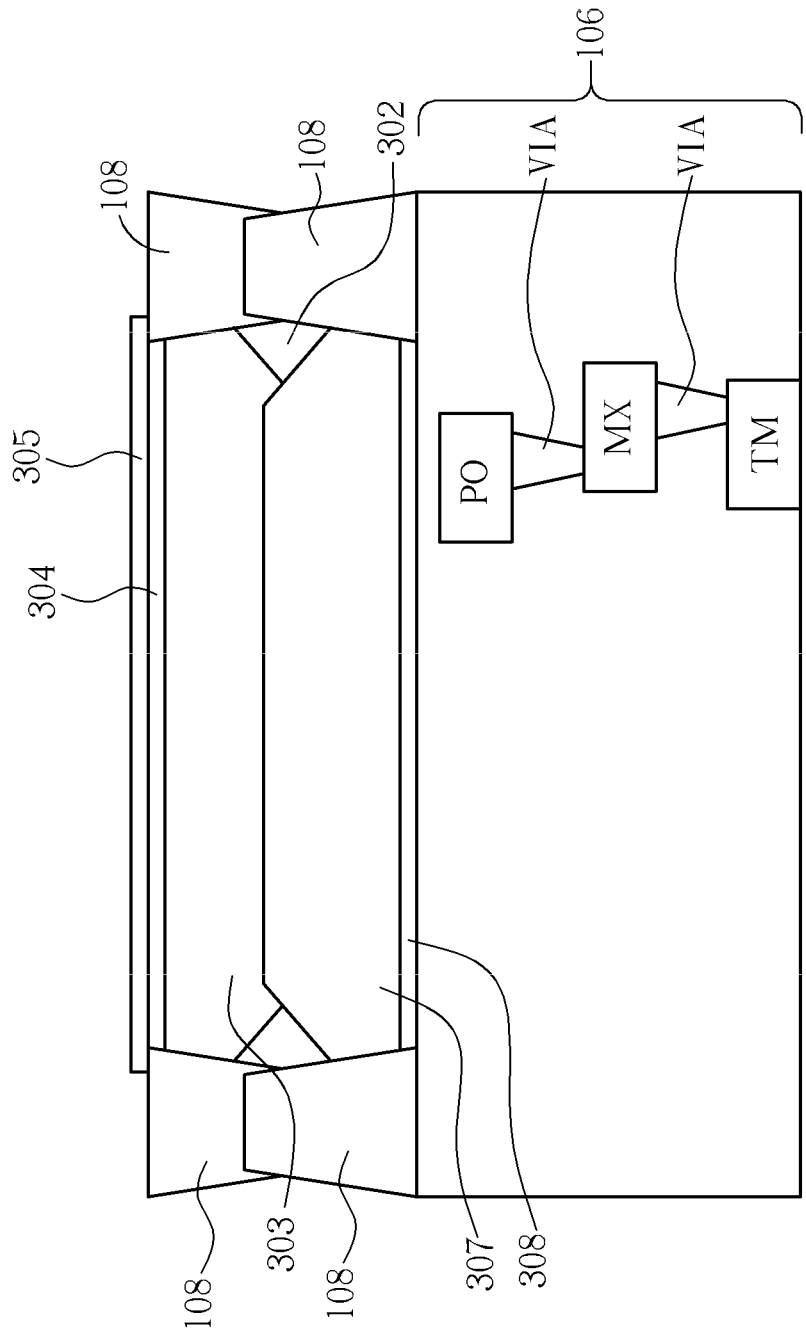
FIG. 3J is a diagram illustrating the partial cross-sectional view of the wafer without the carry layer.

Please refer to FIGS. 3A-3F in conjunction with FIG. 2. FIGS. 3A-3F are diagrams illustrating the partial cross-sectional view of the fabricating process of the BSI image sensor 100 as shown in FIG. 1. According to the preferred embodiment, the method 200 comprises of the following steps:

Step 202: Provide a substrate layer 301 having an epitaxial layer 302 formed in one side (FIG. 3A);

Step 204: Implant a first type of dopant into the epitaxial layer 302 disposed over a first side of the substrate layer 301 to form a dopant layer 303 in a first side of the epitaxial layer 302 (FIG. 3B);

Step 206: Implant a second type of dopant into the dopant layer 303 to form a dopant layer 304 on the dopant layer 303 after forming the dopant layer 303 in the first side of the epitaxial layer 302 (FIG. 3C);

Step 208: Form a glue layer 305 over the dopant layer 304 (FIG. 3D);

Step 210: Adhere a carry layer 306 on the glue layer 305 for carrying the substrate layer 301 (FIG. 3E);

Step 212: Grind a second side of the substrate layer 301 for exposing a second side of the epitaxial layer 302 (FIG. 3F);

Step 214: Implant the first type of dopant into the epitaxial layer 302 from the second side of the epitaxial layer 302 to form a dopant layer 307 in the second side of the epitaxial layer 302, wherein the dopant layer 303 overlaps the dopant layer 307 (FIG. 3G);

Step 216: Anneal at least the dopant layer 303 and the dopant layer 307;

Step 216: Form at least one metal layer over the dopant layer 307 after forming the dopant layer 307 in the second side of the epitaxial layer 302 (FIG. 3H);

Step 220: Illuminate ultraviolet light to the glue layer 305 through the carry layer 306 to de-glue the glue layer 305 (FIG. 3J);

Step 222: Remove the carry layer 306 from the glue layer 305 (FIG. 3J);

Step 224: Form the color filtering module 102 over the dopant layer 305 (FIG. 1).

It should be noted that, provided that substantially the same result is achieved, the steps of the flowchart shown in FIG. 2 need not be in the exact order shown and need not be contiguous, that is, other steps can be intermediate. In addition, in this preferred embodiment, the first type of dopant is an N-type dopant, and the second type of dopant is a P-type dopant, but this is not a limitation of the present invention. In another embodiment, the first type of dopant may be an N-type dopant, and the second type of dopant may be a P-type dopant.

In step 204, the N-type dopant is implanted into the epitaxial layer 302 disposed over a first side of the substrate layer 301 to form the dopant layer 303 as shown in FIG. 3B. It can be seen that the distribution of the N-type dopant is not evenly distributed in the epitaxial layer 302. In fact, the deeper in the epitaxial layer 302 one would go, less of the N-type dopant can be implanted. Therefore, the distribution of the N-type dopant decreases gradually towards deeper in the epitaxial layer 302, and a slope of N-type dopant is generated in the edge of the dopant layer 303 as shown in FIG. 3B.

Then, in step 206, the P-type dopant is implanted into the dopant layer 303 to form the dopant layer 304 on the dopant layer 303 after forming the dopant layer 303 in the first side of the epitaxial layer 302. It should be noted that the depth of the dopant layer 304 should be shallower than the depth of the dopant layer 303 as shown FIG. 3C. In addition, the isolation structure 108 is formed around the dopant layer 303 and the dopant layer 304 to define a region of one pixel. It is also should be noted that, so far, the thicknesses of the dopant layer 303 and the isolation structure 108 are less than the thickness of the epitaxial layer 302.

Then, the carry layer 306 should be attached to the dopant layer 304 in order to carry the substrate layer 301. Firstly, the glue layer 305 is disposed over the dopant layer 304 as shown in FIG. 3D. Then, the carry layer 306 is adhered on the glue layer 305 to form the structure as shown in FIG. 3E. It should be noted that the carry layer is for example a transparent material layer, but is not limited thereto. For example, in this preferred embodiment, the transparent material layer is a glass layer.

After the carry layer 306 is formed, the forming structure can be firmly fixed via fixing the carry layer 306. Then, the substrate layer 301 can be removed by grinding the second side of the substrate layer 301. In other words, the second side of the substrate layer 301 is ground until the second side of the epitaxial layer 302 is exposed as shown in FIG. 3F.

When the second side of the epitaxial layer 302 is exposed, the N-type dopant is implanted into the epitaxial layer 302 from the exposed second side of the epitaxial layer 302 to form the dopant layer 307 in the second side of the epitaxial layer 302 as shown in FIG. 3G. It should be noted that the dopant layer 303 is overlapped with the dopant layer 307 in order to make the region implanted by the N-type dopant as wide as possible. By doing this, the sensitivity of the photodiode 104 formed by the dopant layers 303, 307 and the dopant layer 304 can be improved tremendously. In addition, the P-type dopant is implanted into the dopant layer 307 to form the dopant layer 308 (e.g., the P-well) on the dopant layer 307 after forming the dopant layer 307 in the second side of the epitaxial layer 302. It should be noted that the depth of the dopant layer 308 should be shallower than the depth of the dopant layer 307 as shown FIG. 3G. Similarly, the isolation structure 108 on the second side of the epitaxial layer 302 is also formed around the dopant layer 307. It also should be noted that the isolation structure 108 on the second side of the epitaxial layer 302 is also overlapped with the isolation structure 108 on the first side of the epitaxial layer 302.

Then, an annealing process is performed upon the dopant layers 303, 304, 307, and 308 to recover the damage of the crystal structure caused by the ion (i.e., the dopant) implantation.

When the photo-diode 104 is formed, the circuit layer 106 can be generated in/over the P-well (i.e., the dopant layer 308)

to receive the electrical signals from the photo-diode 14. It should be noted that the circuit layer 106 may comprise a transistor, a poly path, a metal path, and a contact (i.e., via). For brevity, the circuit layer 106 in this preferred embodiment is illustrated by the simplified diagram, i.e., the poly path is illustrated by the diagram labeled as PO, the metal path is illustrated by the diagram labeled as MX, TM, and the contact is illustrated by the diagram labeled as VIA as shown in FIG. 3H.

So far, the main structure of the BSI image sensor 100 is completed except for the color filtering module 102. To form the color filtering module 102 over the first side of the dopant layer 302, the carry layer 306 should be removed first. It should be noted that, in this preferred embodiment, the glue layer 305 is UV (Ultraviolet) glue, therefore the glue layer 305 can be de-glued by illuminating ultraviolet light onto the glue layer 305 through the carry layer 306 since the carry layer 306 is a transparent material layer (FIG. 3I). When the glue layer 305 is de-glued by the ultraviolet light, the carry layer 306 can be removed from the glue layer 305 easily as shown in the FIG. 3J.

Finally, in step 224, the color filtering module 102 can be installed over the dopant layer 305 after the carry layer 306 is removed from the glue layer 305. It should be noted that, in this preferred embodiment, the de-glued glue layer 305 can remain, but this is not a limitation of the present invention, between the color filtering module 102 and the dopant layer 304 since the de-glued glue layer 305 is a transparent material layer, which will not block the incident light inputted to the photo-diode 104. Furthermore, in this preferred embodiment, the color filtering module 102 comprises a microlens 1022 and a color filter 1024.

Please refer to FIG. 1 again. Since the dopant layer 303 overlaps the dopant layer 307 (i.e., the slope of the N-type dopant in the edge of the dopant layer 303 overlaps the slope of the N-type dopant in the edge of the dopant layer 307), the N-type dopant coverage area (i.e., the N-type dopant of the photo-diode 104) between the color filtering module 102 and the circuit layer 106 is enlarged to make the photo-diode 104 transform more incident light into electrical signals, i.e., reduce the loss of the incident light. In other words, the presented BSI image sensor 100 is more sensitive to the incident light.

Briefly, the exemplary embodiment of the present invention allows the back-side illumination image sensor to perform the whole wafer annealing to improve the throughput of the fabricating process. Furthermore, the shallow problem caused by the slope of the N-type dopant in the edge of the dopant layer in the photo-diode is also solved. With the utilization of the UV glue, the glue layer utilized to fix the carry layer can be de-glued by merely illuminating ultraviolet light to the glue layer, and thus the step of removing the carry layer does not increase the complexity of the manufacturing process.

Those skilled in the art will readily observe that numerous modifications and alterations of the device and method may be made while retaining the teachings of the invention.

What is claimed is:

1. A method for fabricating a back-side illumination (BSI) image sensor, comprising:
    implanting a first type of dopant into an epitaxial layer disposed over a first side of a substrate layer to form a first dopant layer in a first side of the epitaxial layer;
    adhering a carry layer over the first dopant layer for carrying the substrate layer;
    grinding a second side of the substrate layer for exposing a second side of the epitaxial layer;
    implanting the first type of dopant into the epitaxial layer from the second side of the epitaxial layer to form a second dopant layer in the second side of the epitaxial layer, wherein the first dopant layer overlaps the second dopant layer;
    forming at least one metal layer over the second dopant layer after forming the second dopant layer in the second side of the epitaxial layer;
    removing the carry layer; and
    forming a color filtering module over the first dopant layer.

2. The method of claim 1, wherein the first type of dopant is an N-type dopant.

3. The method of claim 1, further comprising:
    implanting a second type of dopant into the first dopant layer to form a third dopant layer on the first dopant layer after forming the first dopant layer in the first side of the epitaxial layer.

4. The method of claim 3, wherein the first type of dopant is an N-type dopant, and the second type of dopant is a P-type dopant.

5. The method of claim 1, further comprising:
    implanting a second type of dopant into the second dopant layer to form a third dopant layer on the second dopant layer after forming the second dopant layer in the second side of the epitaxial layer.

6. The method of claim 5, wherein the first type of dopant is an N-type dopant, and the second type of dopant is a P-type dopant.

7. The method of claim 1, further comprising:
    before forming at least one metal layer over the second dopant layer formed in the second side of the epitaxial layer, annealing at least the first dopant layer and the second dopant layer.

8. The method of claim 1, wherein the step of adhering the carry layer over the first dopant layer comprises:
    forming a glue layer over the first dopant layer; and
    adhering the carry layer on the glue layer.

9. The method of claim 8, wherein the carry layer is a transparent material layer.

10. The method of claim 9, wherein the transparent material layer is a glass layer.

11. The method of claim 9, wherein the step of removing the carry layer comprises:
    illuminating ultraviolet light to the glue layer through the transparent material layer to de-glue the glue layer; and
    removing the transparent material layer from the glue layer.

* * * * *